(12) United States Patent
Inoue et al.

(10) Patent No.: US 9,265,141 B2
(45) Date of Patent: Feb. 16, 2016

(54) OPTO-ELECTRIC HYBRID BOARD AND MANUFACTURING METHOD THEREFOR

(75) Inventors: Masami Inoue, Ibaraki (JP); Masayuki Hodono, Ibaraki (JP); Akiko Nagafuji, Ibaraki (JP); Yuichi Tsujita, Ibaraki (JP); Mitsuru Honjo, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 727 days.

(21) Appl. No.: 13/406,674

(22) Filed: Feb. 28, 2012

(65) Prior Publication Data

US 2012/0237158 A1 Sep. 20, 2012

Related U.S. Application Data

(60) Provisional application No. 61/473,525, filed on Apr. 8, 2011.

(30) Foreign Application Priority Data

Mar. 16, 2011 (JP) .................................. 2011-058573

(51) Int. Cl.
*G02B 6/12* (2006.01)
*H05K 1/02* (2006.01)
(Continued)

(52) U.S. Cl.
CPC .............. *H05K 1/0274* (2013.01); *G02B 6/424* (2013.01); *G02B 6/428* (2013.01); *G02B 6/4214* (2013.01); *G02B 6/4257* (2013.01); *H05K 1/181* (2013.01); *H05K 2201/09072* (2013.01); *H05K 2201/10121* (2013.01); *Y10T 29/4913* (2015.01)

(58) Field of Classification Search
None
See application file for complete search history.

(56) References Cited

U.S. PATENT DOCUMENTS 6,287,017 B1 * 9/2001 Katsura et al. ................. 385/59
6,404,960 B1 6/2002 Hibbs-Brenner et al.
(Continued)

FOREIGN PATENT DOCUMENTS

| CN | 101859006 A | 10/2010 |
|----|-------------|---------|
| JP | 05-167060 A | 7/1993 |

(Continued)

OTHER PUBLICATIONS

Chinese Office Action dated Sep. 28, 2014, issued in corresponding Chinese Application No. 2012100463663; w/English Translation. (19 pages).

(Continued)

*Primary Examiner* — Tina Wong
(74) *Attorney, Agent, or Firm* — Westerman, Hattori, Daniels & Adrian, LLP

(57) ABSTRACT

Provided are an opto-electric hybrid board which eliminates the necessity of an aligning operation of a core of an optical waveguide unit and an optical element of an electric circuit unit and which is excellent in mass-productivity, and a manufacturing method therefor. The opto-electric hybrid board includes an optical waveguide unit and an electric circuit unit having an optical element mounted thereon, the electric circuit unit being coupled to the optical waveguide unit. The optical waveguide unit includes fitting holes which are formed in a surface of an overcladding layer and are located and formed at predetermined locations with respect to one end surface of a core. The electric circuit unit includes protruding portions which fit into the fitting holes and are located and formed at predetermined locations with respect to the optical element.

7 Claims, 5 Drawing Sheets

(51) Int. Cl.
  *G02B 6/42* (2006.01)
  *H05K 1/18* (2006.01)

(56) References Cited

U.S. PATENT DOCUMENTS

| | | | |
|---|---|---|---|
| 8,292,515 B2* | 10/2012 | Liao et al. | 385/74 |
| 8,915,657 B2* | 12/2014 | Inoue et al. | 385/91 |
| 2004/0156576 A1* | 8/2004 | Windover | 385/14 |
| 2005/0100264 A1* | 5/2005 | Kim et al. | 385/14 |
| 2005/0207718 A1* | 9/2005 | Komura et al. | 385/129 |
| 2007/0297713 A1 | 12/2007 | Lu et al. | |
| 2009/0288341 A1 | 11/2009 | Kania et al. | |
| 2009/0297096 A1 | 12/2009 | Hodono | |
| 2010/0254666 A1 | 10/2010 | Hodono | |
| 2011/0019960 A1* | 1/2011 | Matsubara et al. | 385/14 |
| 2011/0097039 A1* | 4/2011 | Zhao et al. | 385/70 |

FOREIGN PATENT DOCUMENTS

| | | |
|---|---|---|
| JP | 5-196831 A | 8/1993 |
| JP | 2000-221368 A | 8/2000 |
| JP | 2001-507814 A | 6/2001 |
| JP | 2002-267893 A | 9/2002 |
| JP | 2004-029621 A | 1/2004 |
| JP | 2005-292379 A | 10/2005 |
| JP | 2005-301114 A | 10/2005 |
| JP | 2007-072307 A | 3/2007 |
| JP | 2009-223063 A | 10/2009 |
| JP | 2009-288341 A | 12/2009 |
| JP | 2009-288636 A | 12/2009 |

OTHER PUBLICATIONS

Japanese Office Action dated Mar. 24, 2015, issued in corresponding JP Patent Application No. 2011-058573 with English translation (6 pages).
Japanese Office Action dated Nov. 4, 2014, issued in Japanese Patent Application No. 2011-058573, w/English translation (7 pages).
Office Action dated Apr. 21, 2015, issued in corresponding Chinese Patent Application No. 201210046366.3, with English translation (20 pages).
Decision of Rejection and Decision of Rejection of the Amendment dated Oct. 6, 2015, issued in counterpart Japanese Patent Application No. 2011-058573, w/English translation (6 pages).

* cited by examiner

OPTO-ELECTRIC HYBRID BOARD AND MANUFACTURING METHOD THEREFOR

RELATED APPLICATIONS

This application claims the benefit of U.S. Provisional Application No. 61/473,525 filed on Apr. 8, 2011, which is hereby incorporated by reference.

BACKGROUND OF THE INVENTION

1. Field of the Invention

The present invention relates to an opto-electric hybrid board which includes an optical waveguide unit and an electric circuit unit having an optical element mounted thereon, and to a manufacturing method therefor.

2. Description of the Related Art

In recent electronic devices or the like, as the amount of transmission information increases, in addition to electric wiring, optical wiring is adopted. More specifically, an opto-electric hybrid board including an electric circuit unit in which an optical element such as a light-emitting element for converting an electrical signal into an optical signal or a light-receiving element for converting an optical signal into an electrical signal is mounted on an electric circuit board having electric wiring formed thereon, and an optical waveguide unit in which an optical waveguide as optical wiring for transmitting the optical signal is formed is incorporated in the electronic device or the like.

In the opto-electric hybrid board, light which is emitted from the light-emitting element is required to enter one end surface (light entrance) of a core (optical wiring) of the optical waveguide unit, and light which exits the other end surface (light exit) of the core is required to be received by the light-receiving element. Therefore, it is necessary that the optical element (the light-emitting element or the light-receiving element) and the core be aligned with each other.

Accordingly, methods of aligning the optical element and the core are conventionally proposed. In an exemplary method, an optical waveguide unit is fixed and, under a state in which light is emitted from a light-emitting element to one end surface (light entrance) of a core of the optical waveguide unit while the location of the light-emitting element is changed, the intensity of light which exits from the other end surface (light exit) of the core is monitored, and the location at which the intensity becomes the highest is determined as the alignment location (see JP-A1-HEI5 (1993)-196831). In another exemplary method, a connector having holes for locating formed therein is attached to an optical waveguide unit, pins for locating, which fit into the holes, are attached to an electric circuit unit, and, by fitting the pins into the holes, respectively, an optical element and a core of the optical waveguide unit are automatically aligned (see JP-A1-2009-223063).

However, in the aligning method described in JP-A1-HEI5 (1993)-196831 above, although alignment with high accuracy is possible, it takes time and effort, and thus, the method lacks mass-productivity. Further, in the aligning method described in JP-A1-2009-223063 above, although position adjustment may be carried out in a simple method of fitting the pins into the holes, respectively, not only dimensional deviations are caused when the connector and the pins are respectively manufactured but also misalignment of the attachment location of the connector with respect to the optical waveguide unit, misalignment of the attachment location of the pins for locating with respect to the electric circuit unit, and the like are caused. Accumulation of those dimensional deviations and misalignments lowers the accuracy of the alignment. If enhancement of the accuracy of the alignment is attempted, control of the dimensional accuracy is necessary so that the dimensional deviations and misalignments are not caused, and thus the cost increases and the method lacks mass-productivity.

SUMMARY OF THE INVENTION

An opto-electric hybrid board is provided which eliminates the necessity of an aligning operation of a core of an optical waveguide unit and an optical element of an electric circuit unit and which is excellent in mass-productivity. A manufacturing method therefor is also provided.

An opto-electric hybrid board is provided, including: an optical waveguide unit; and an electric circuit unit having an optical element mounted thereon, the electric circuit unit being coupled to the optical waveguide unit, in which: the optical waveguide unit includes: an undercladding layer; a core for an optical path, which is formed on a surface of the undercladding layer; an overcladding layer which covers the core; and a fitting hole for locating the electric circuit unit, which is formed in a surface of the overcladding layer; the electric circuit unit includes: an electric circuit board; the optical element mounted at a predetermined portion on the electric circuit board; and a protruding portion which fits into the fitting hole; the fitting hole of the optical waveguide unit is located and formed at a predetermined location with respect to an end surface of the core; the protruding portion of the electric circuit unit is located and formed at a predetermined location with respect to the optical element; and the optical waveguide unit and the electric circuit unit are coupled to each other in a state in which the protruding portion of the electric circuit unit fits into the fitting hole of the optical waveguide unit.

Further, there is provided a manufacturing method for an opto-electric hybrid board in which an optical waveguide unit and an electric circuit unit having an optical element mounted thereon are coupled, the method including: manufacturing the optical waveguide unit including: forming an undercladding layer; forming, on a surface of the undercladding layer, a core for an optical path; and forming an overcladding layer so as to cover the core, the forming an overcladding layer including forming a fitting hole for locating the electric circuit unit at a predetermined location located with respect to an end surface of the core; manufacturing the electric circuit unit including: forming an electric circuit board; and mounting the optical element at a predetermined portion on the electric circuit board, the forming an electric circuit board including forming a protruding portion which fits into the fitting hole at a predetermined location located with respect to an expected mounting location of the optical element; and coupling the optical waveguide unit and the electric circuit unit to manufacture the opto-electric hybrid board, the coupling including fitting the protruding portion of the electric circuit unit into the fitting hole of the optical waveguide unit.

The optical waveguide unit and the electric circuit unit having the optical element mounted thereon are coupled. In the optical waveguide unit, an end surface of a core and a fitting hole for locating the electric circuit unit are in a positional relationship of being located with respect to each other. Further, in the electric circuit unit, the optical element and a protruding portion which fits into the fitting hole of the optical waveguide unit are in a positional relationship of being located with respect to each other. Therefore, in a state in which the protruding portion of the electric circuit unit fits into the fitting hole of the optical waveguide unit, that is, in a state in which the optical waveguide unit and the electric circuit unit are coupled to each other, the core of the optical waveguide unit and the optical element of the electric circuit unit are automatically aligned. In addition, the fitting hole of the optical waveguide unit is formed in a surface of an overcladding layer which form the optical waveguide unit, while the protruding portion of the electric circuit unit is formed in the electric circuit unit. Therefore, an additional component such as a connector is not provided for fitting the protruding portion into the fitting hole. Therefore, in the coupling between the optical waveguide unit and the electric circuit unit, there is no accumulation of dimensional deviations and misalignments due to such additional components including a connector, and the core of the optical waveguide unit and the optical element of the electric circuit unit are aligned with high accuracy. As described above, in the opto-electric hybrid board, the core and the optical element are formed to be automatically aligned with high accuracy by a simple operation of fitting the protruding portion of the electric circuit unit into the fitting hole of the optical waveguide unit, and thus an aligning operation which takes time and effort is not necessary and the opto-electric hybrid board is excellent in mass-productivity. Further, an additional component such as a connector is not necessary for fitting the protruding portion into the fitting hole, and thus control of the dimensional accuracy of the connector or the like is not necessary. In this regard, also, the opto-electric hybrid board is excellent in mass-productivity.

In particular, when a depressed portion into which an end of the optical waveguide unit fits is formed in the electric circuit unit and the protruding portion is formed in the depressed portion, by causing the end of the optical waveguide unit to fit into the depressed portion of the electric circuit unit, misalignment of the optical waveguide unit with respect to the electric circuit unit is prevented with greater reliability, and thus, the alignment between the core and the optical element may be maintained with greater reliability.

The manufacturing method for the opto-electric hybrid board is carried out by coupling an optical waveguide unit and an electric circuit unit having an optical element mounted thereon. In a step of manufacturing the optical waveguide unit, a fitting hole for locating the electric circuit unit is formed at a predetermined location which is located with respect to an end surface of a core. Further, in a step of manufacturing the electric circuit unit, a protruding portion which fits into the fitting hole of the optical waveguide unit is formed at a predetermined location which is located with respect to the optical element. Therefore, by fitting the protruding portion of the electric circuit unit into the fitting hole of the optical waveguide unit to couple the optical waveguide unit and the electric circuit unit, the core of the optical waveguide unit and the optical element of the electric circuit unit may be automatically aligned. In addition, the fitting hole of the optical waveguide unit is formed in the surface of the overcladding layer which forms the optical waveguide unit while the protruding portion of the electric circuit unit is formed in a part of an electric circuit board which forms the electric circuit unit. Therefore, an additional component such as a connector is not necessary for the purpose of fitting the protruding portion into the fitting hole. Therefore, in the coupling between the optical waveguide unit and the electric circuit unit, there is no accumulation of dimensional deviations and misalignments due to such an additional component including a connector, and the core of the optical waveguide unit and the optical element of the electric circuit unit are aligned with high accuracy. As described above, in the manufacturing method for the opto-electric hybrid board according to the present invention, the core and the optical element are automatically aligned with high accuracy by a simple operation of fitting the protruding portion of the electric circuit unit into the fitting hole of the optical waveguide unit. Therefore, an aligning operation which takes time and effort is not necessary and the method is excellent in mass-productivity. Further, an additional component such as a connector is not necessary for fitting the protruding portion into the fitting hole, and thus control of the dimensional accuracy of the connector or the like is not necessary. In this regard, also, the method is excellent in mass-productivity.

In particular, when a depressed portion into which an end of the optical waveguide unit fits is formed in the electric circuit unit and the protruding portion is formed in the depressed portion, by causing the end of the optical waveguide unit to fit into the depressed portion of the electric circuit unit, misalignment of the optical waveguide unit with respect to the electric circuit unit may be prevented with greater reliability.

DETAILED DESCRIPTION OF THE INVENTION

Next, an embodiment of the present invention is described in detail with reference to the drawings.

Figure 1A:
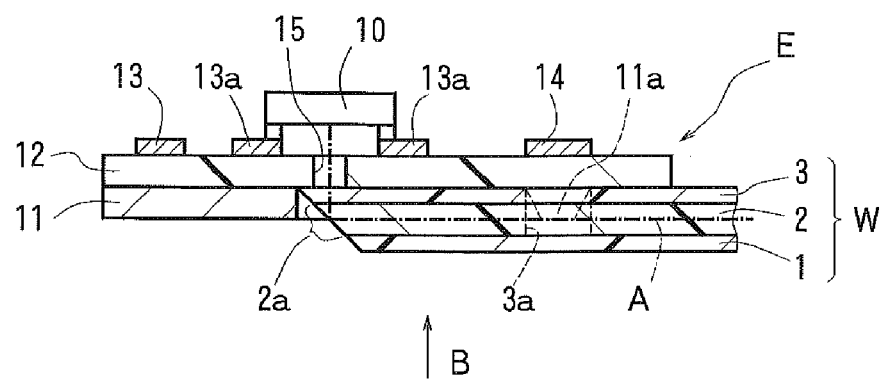
FIG. 1A is a longitudinal sectional view schematically illustrating an embodiment of an opto-electric hybrid board.
Figure 1B:
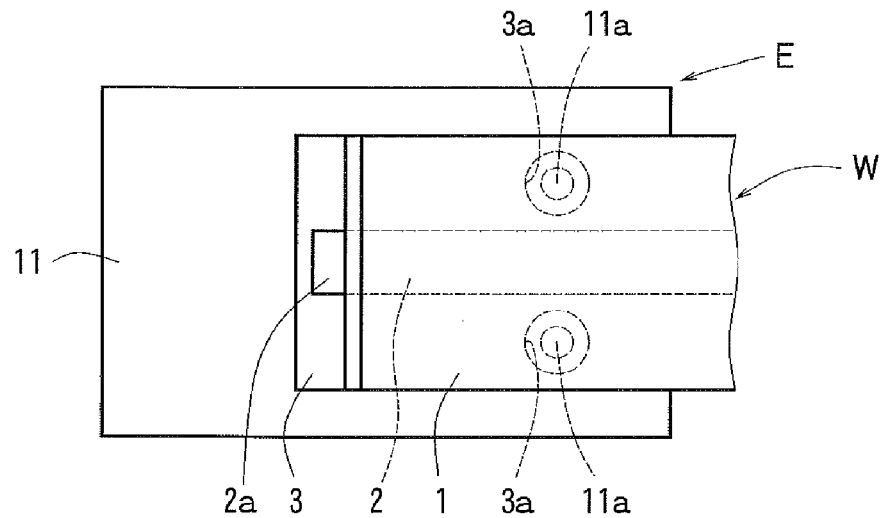
FIG. 1B is a view taken in the direction of the arrow B of FIG. 1A.

FIG. 1A is a longitudinal sectional view schematically illustrating an embodiment of an opto-electric hybrid board, and FIG. 1B is a bottom view thereof (a view taken in the direction of the arrow B of FIG. 1A). In the opto-electric hybrid board, an optical waveguide unit W having fitting holes 3a for locating an electric circuit unit and an electric circuit unit E having protruding portions 11a which fit into the fitting holes 3a, respectively, are separately manufactured, and the optical waveguide unit W and the electric circuit unit E are coupled to be integral by fitting the protruding portions 11a of the electric circuit unit E into the fitting holes 3a of the optical waveguide unit W, respectively. Here, in the optical waveguide unit W, the fitting holes 3a are located and formed at predetermined locations with respect to one end surface (inclined surface) 2a of a core 2 (at locations which are set in advance so that, when the units W and E are coupled, the one end surface 2a of the core 2 of the optical waveguide unit W faces an optical element 10 of the electric circuit unit E). Further, in the electric circuit unit E, the protruding portions 11a which fit into the fitting holes 3a, respectively, are located and formed at predetermined locations with respect to the optical element 10 (at locations which are set in advance so that, when the units W and E are coupled, the optical element 10 of the electric circuit unit E faces the one end surface 2a of the core 2 of the optical waveguide unit W). Therefore, in the opto-electric hybrid board, by fitting the protruding portions 11a into the fitting holes 3a, respectively, the one end surface 2a of the core 2 and the optical element 10 are appropriately located in an aligned state. More specifically, the one end surface 2a of the core 2 reflects light so that the light may be transmitted between the core 2 and the optical element 10. In FIG. 1A, a dot-and-dash line A indicates a light transmission path, and it is illustrated that the light transmission is made without a loss, due to the alignment described above.

Figure 2A:
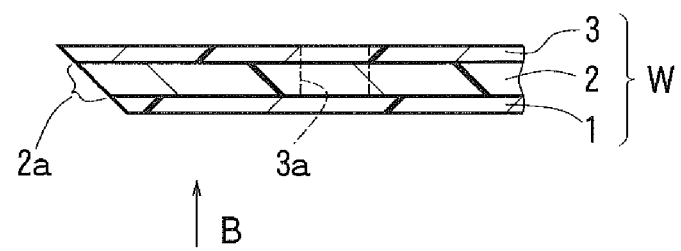
FIG. 2A is a longitudinal sectional view schematically illustrating an optical waveguide unit which forms the opto-electric hybrid board.
Figure 2B:
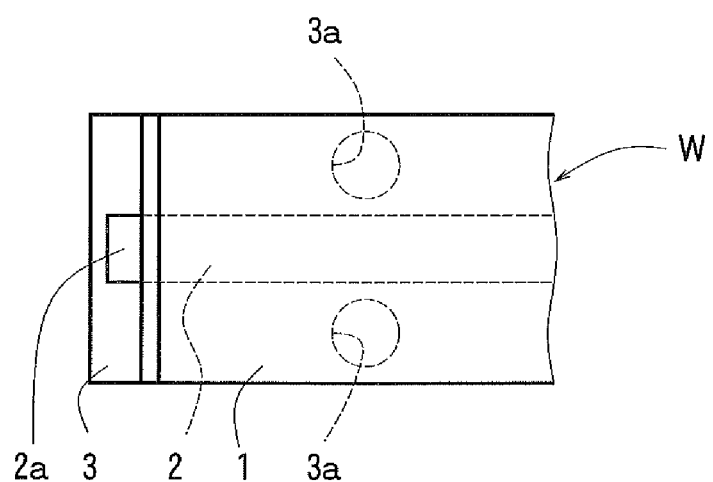
FIG. 2B is a view taken in the direction of the arrow B of FIG. 2A.

Description is made in more detail. The optical waveguide unit W includes an undercladding layer 1, the core 2 for an optical path formed on a surface of the undercladding layer 1 in a predetermined linear pattern, and an overcladding layer 3 formed on the surface of the undercladding layer 1 so as to cover the core 2, as illustrated in FIG. 2A as a longitudinal sectional view and in FIG. 2B as a bottom view (view taken in the direction of the arrow B of FIG. 2A). Further, one end edge (left end edge in FIGS. 2A and 2B) of the optical waveguide unit W is formed as an inclined surface which is inclined 45° with respect to an axial direction of the core 2, and the one end surface 2a of the core 2 which is located at the inclined surface is a light reflecting surface. The fitting holes 3a for locating the electric circuit unit are formed in a surface of the overcladding layer 3 in a state of being located at predetermined locations with respect to the one end surface 2a of the core 2. In this embodiment, the fitting holes 3a are cylindrical and two fitting holes 3a are formed so as to be symmetric with each other with respect to the core 2 therebetween. The two fitting holes 3a are located and formed at predetermined locations with respect to the one end surface (light reflecting surface) 2a of the core 2.

Figure 3A:
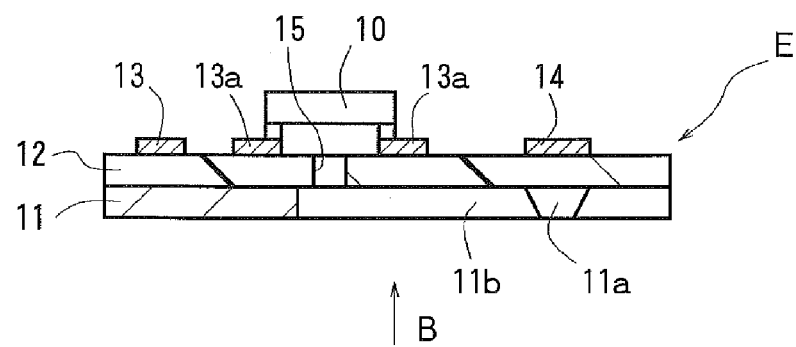
FIG. 3A is a longitudinal sectional view schematically illustrating an electric circuit unit which forms the opto-electric hybrid board.
Figure 3B:
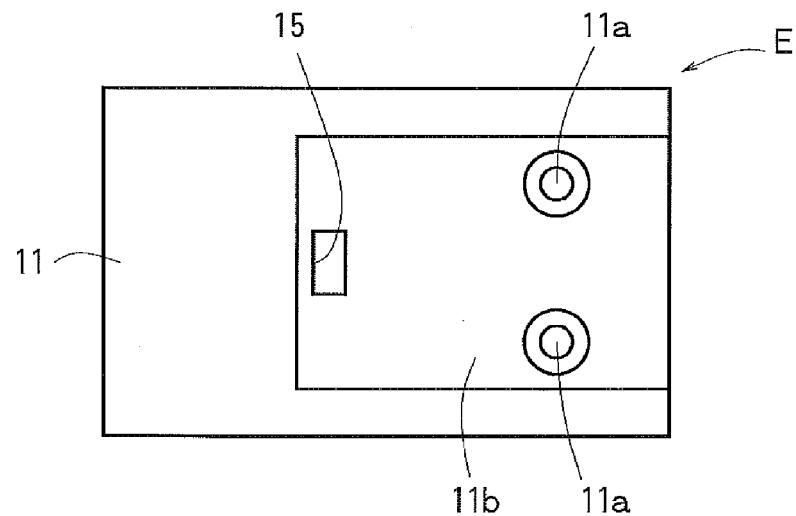
FIG. 3B is a view taken in the direction of the arrow B of FIG. 3A.

Meanwhile, the electric circuit unit E includes a substrate 11, an insulating layer 12 formed on a surface of the substrate 11, an electric circuit 13 which is formed on a surface of the insulating layer 12 and which includes a pad 13a for mounting the optical element, and the optical element 10 mounted on the pad 13a for mounting the optical element, as illustrated in FIG. 3A as a longitudinal sectional view and in FIG. 3B as a bottom view (view taken in the direction of the arrow B of FIG. 3A). Further, the electric circuit unit E has a through hole 15 for the optical path formed therein at a corresponding portion under the optical element 10. Further, in this embodiment, apart of the substrate 11 is formed into the protruding portions 11a which fit into the fitting holes 3a of the optical waveguide unit W (see FIGS. 2A and 2B), respectively, and a substantially rectangular portion of the substrate 11 around the protruding portions 11a is removed, such that the protruding portions 11a are formed in a depressed portion 11b. The depressed portion 11b is formed into a shape which corresponds to one end of the optical waveguide unit W so that the one end may fit thereinto. Further, the protruding portions 11a are located and formed at predetermined locations with respect to the optical element 10. Still further, in this embodiment, each of the protruding portions 11a is formed into the shape of a frustum of a cone.

Note that, together with the electric circuit 13 including the pad 13a for mounting the optical element, a protruding portion locating circuit 14 used as a guide (alignment mark) when the protruding portions 11a are located and formed is formed on the surface of the insulating layer 12. The protruding portion locating circuit 14 is formed on a rear surface side of locations corresponding to the protruding portions 11a. Further, a plating layer (not shown) is formed on surfaces of the pad 13a for mounting the optical element, the electric circuit 13, and the protruding portion locating circuit 14. In this embodiment, a flip chip type element is used as the optical element 10, and a light-emitting portion or a light-receiving portion thereof is formed on a surface on a mounting side of the optical element 10 (lower surface in FIG. 3A).

In the opto-electric hybrid board, as illustrated in FIGS. 1A and 1B, the optical waveguide unit W and the electric circuit unit E are coupled to be integral in a state in which the protruding portions 11a of the electric circuit unit E fit into the fitting holes 3a of the optical waveguide unit W. Here, as described above, the fitting holes 3a formed in the optical waveguide unit W are located and formed at the predetermined locations with respect to the one end surface 2a of the core 2. Further, the protruding portions 11a formed in the electric circuit unit E are located and formed at the predetermined locations with respect to the optical element 10. Therefore, by fitting the protruding portions 11a into the fitting holes 3a, the one end surface 2a of the core 2 and the optical element 10 are appropriately located in an aligned state automatically.

Further, in this embodiment, each of the protruding portions 11a of the electric circuit unit E is formed into the shape of a frustum of a cone, and thus, even when the inside diameter of the fitting holes 3a and the outside diameter of the protruding portions 11a are, for example, dimensionally contracted, the protruding portions 11a coaxially fit into the fitting holes 3a, respectively, to thereby prevent misalignment between the optical waveguide unit W and the electric circuit unit E in a direction of a plane perpendicular to an axis thereof.

The opto-electric hybrid board is manufactured through the following steps (1) to (3):
(1) a step of manufacturing the optical waveguide unit W (see FIGS. 4A to 4E);
(2) a step of manufacturing the electric circuit unit E (see FIGS. 5A to 5F); and
(3) a step of coupling the optical waveguide unit W to the electric circuit unit E.

<(1) Step of Manufacturing Optical Waveguide Unit W>

The step of manufacturing the optical waveguide unit W of the above-mentioned item (1) is described. First, a plate-like base 20 (see FIG. 4A) used when the undercladding layer 1 is formed is prepared. The forming material for the base 20 is, for example, glass, quartz, silicon, a resin, or a metal. Among them, a substrate formed of a stainless steel is preferred, because a substrate formed of a stainless steel is excellent in resistance to expansion and contraction due to heat and various dimensions thereof are substantially maintained at design values in the process of manufacturing the optical waveguide unit W. Further, the thickness of the base 20 is set within a range of, for example, 20 μm to 1 mm.

Figure 4A:
FIGS. 4A to 4E are explanatory views schematically illustrating manufacturing steps for the optical waveguide unit in a manufacturing method for the opto-electric hybrid board.

Next, as illustrated in FIG. 4A as a transverse sectional view, the undercladding layer 1 is formed by photolithography in a predetermined region on a surface of the base 20. As the forming material for the undercladding layer 1, a photosensitive resin such as a photosensitive epoxy resin is used. The thickness of the undercladding layer 1 is set within a range of, for example, 5 to 50 μm.

Figure 4B:
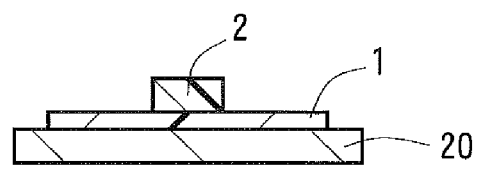

Then, as illustrated in FIG. 4B as a transverse sectional view, the core 2 in the predetermined pattern and the alignment mark (not shown) are simultaneously formed on the surface of the undercladding layer 1 by photolithography. That is, the core 2 and the alignment mark are in a positional relationship of being located with respect to each other.

The forming material for the core 2 and the alignment mark is, for example, a photosensitive resin similar to the case of the undercladding layer 1, and a material having the refractive index higher than those of forming materials for the undercladding layer 1 and the overcladding layer 3 (see FIG. 4C) is used. The adjustment of the refractive index may be made by, for example, selecting the kinds of and adjusting the composition ratios of the forming materials for the undercladding layer 1, the core 2, and the overcladding layer 3. The number of the cores may be one or more than one (one in the case illustrated in FIG. 4B). The pattern of the core 2 is, for example, in the shape of a straight line, branched, or crossed, or may be a combination thereof (in the shape of a straight line in the case illustrated in FIG. 4B). The thickness of the core 2 is set within a range of, for example, 20 to 100 μm. The width of the core 2 is set within a range of, for example, 20 to 100 μm.

Figure 4C:
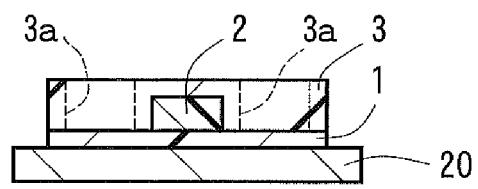

Then, as illustrated in FIG. 4C as a transverse sectional view, the overcladding layer 3 having the fitting holes 3*a* formed therein is formed by photolithography on the surface of the undercladding layer 1 so as to cover the core 2. Specifically, a photomask used in forming the overcladding layer 3 is patterned so that, when the photomask is located with reference to the alignment mark formed in the step of forming the core 2, the portions to be formed as the fitting holes 3*a* are not exposed to radiation. The forming material for the overcladding layer 3 is, for example, a photosensitive resin similar to the case of the undercladding layer 1. The thickness of the overcladding layer 3 (thickness from the surface of the undercladding layer 1) is set within a range of, for example, a thickness greater than the thickness of the core 2 and a thickness of 1,000 μm or smaller. Further, the inside diameter of the fitting holes 3*a* is set within a range of, for example, 0.25 to 5.0 mm.

Figure 4D:
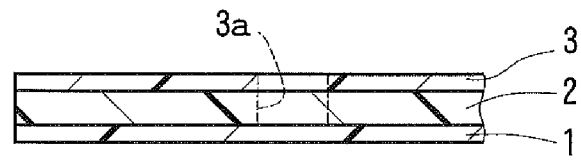
Figure 4E:
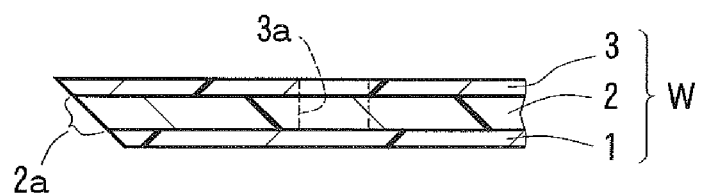

Then, as illustrated in FIG. 4D as a longitudinal sectional view, the base 20 (see FIG. 4C) is separated from a rear surface of the undercladding layer 1. After that, as illustrated in FIG. 4E as a longitudinal sectional view, one end of a laminate including the undercladding layer 1, the core 2, and the overcladding layer 3 is formed into the inclined surface which is inclined 45° with respect to an axial direction of the core 2 by cutting using a rotary blade, laser processing, or the like at a predetermined location with reference to the alignment mark. In this way, the optical waveguide unit W including the undercladding layer 1, the core 2, and the overcladding layer 3 and having the fitting holes 3*a* for locating the electric circuit unit formed in the surface of the overcladding layer 3 is obtained. The thickness of the optical waveguide unit W is set within a range of, for example, 30 to 1,150 μm. Here, both the one end surface 2*a* of the core 2 located at the inclined surface and the fitting holes 3*a* of the overcladding layer 3 are formed at the predetermined locations with reference to the alignment mark, and thus, are in positional relationship of being located with respect to each other. In this way, the step of manufacturing the optical waveguide unit W of the above-mentioned item (1) is completed.

<(2) Step of Manufacturing Electric Circuit Unit E>

Next, the step of manufacturing the electric circuit unit E of the above-mentioned item (2) is described. First, the substrate 11 (see FIG. 5A) is prepared. The forming material for the substrate 11 is, for example, a metal. In particular, a substrate formed of a stainless steel is preferred from the viewpoint of easy processability and dimensional stability. Further, the thickness of the substrate 11 is set within a range of, for example, 0.02 to 0.1 mm.

Figure 5A:
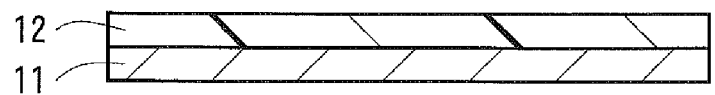
FIGS. 5A to 5F are explanatory views schematically illustrating manufacturing steps for the electric circuit unit in the manufacturing method for the opto-electric hybrid board.

Then, as illustrated in FIG. 5A as a longitudinal sectional view, the insulating layer 12 is formed in a predetermined region of the surface of the substrate 11. With regard to the formation of the insulating layer 12, for example, varnish in which a photosensitive resin such as a photosensitive polyimide resin for forming an insulating layer is dissolved in a solvent is applied, and then, as necessary, the layer formed by applying the varnish is dried by heating treatment to form a photosensitive resin layer for forming the insulating layer. Then, by exposing the photosensitive resin layer to a radiation ray such as an ultraviolet ray via a photomask, the insulating layer 12 in a predetermined shape is formed. The thickness of the insulating layer 12 is set within a range of, for example, 5 to 15 μm.

Figure 5B:
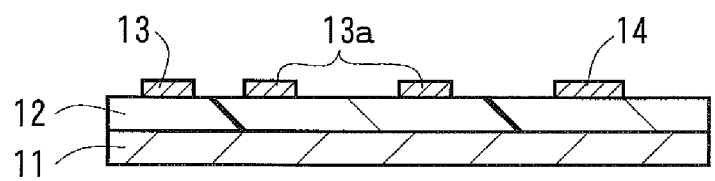

Then, as illustrated in FIG. 5B as a longitudinal sectional view, the electric circuit 13 including the pad 13*a* for mounting the optical element and the protruding portion locating circuit 14 are simultaneously formed on a surface of the insulating layer 12, to thereby manufacture an electric circuit board. The formation of the electric circuit 13 and the like is carried out by, for example, a semi-additive process.

Specifically, first, a metal layer (having a thickness of about 60 to 260 nm) is formed on the surface of the insulating layer 12 by sputtering, electroless plating, or the like. The metal layer becomes a seed layer when electrolytic plating is applied later (layer to be a base metal when an electrolytic plating layer is formed). Then, after photosensitive resists are laminated to both surfaces of a laminate including the substrate 11, the insulating layer 12, and the seed layer, hole portions of the pattern of the electric circuit 13 and the like are simultaneously formed by photolithography in the photosensitive resist on a side having the seed layer formed thereon, and surface portions of the seed layer are exposed at the bottom of the hole portions. Then, an electrolytic plating layer (having a thickness of about 5 to 20 μm) is stacked by electrolytic plating on the surface portions of the seed layer exposed at the bottom of the hole portions. Then, the photosensitive resists are separated by a sodium hydroxide solution or the like. After that, portions of the seed layer which do not have the electrolytic plating layer formed thereon are removed by soft etching, and a stacked portion including the remaining electrolytic plating layer and the seed layer thereunder is formed into the electric circuit 13 and the like. In this way, the electric circuit board is obtained, which includes the substrate 11, the insulating layer 12, the electric circuit 13 including the pad 13*a* for mounting the optical element, and the protruding portion locating circuit 14.

Then, after a photosensitive resist is laminated on a rear surface side (substrate 11 side) of the electric circuit board, the electric circuit board is set in an exposure machine, an image thereof on a front surface side (electric circuit 13 side) and an image thereof on the rear surface side are taken by a camera. Based on the images, the locations of expected protruding portion forming portions on the rear surface side (portions corresponding to the protruding portion locating circuit 14) and of a portion therearound, that is, an expected depressed portion forming portion (depressed portion into which the one end of the optical waveguide unit W (see FIGS. 1A and 1B) fits), are appropriately located at predetermined locations with reference to the protruding portion locating circuit 14, with the protruding portion locating circuit 14 on the front surface side being used as a guide (alignment mark). Then, a portion of the photosensitive resist which corresponds to the expected depressed portion forming portion is removed by photolithography with reference to the protruding portion locating circuit 14 to expose a portion of the surface of the substrate 11 at the bottom of the removed portion.

Figure 5C:
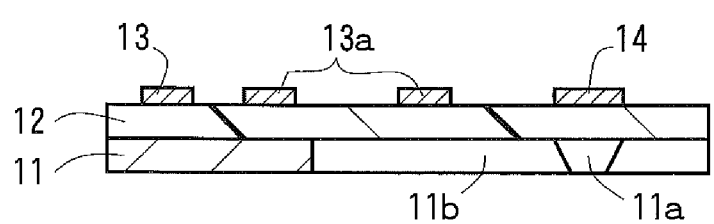

Then, as illustrated in FIG. 5C as a longitudinal sectional view, the exposed portion of the substrate 11 is removed by etching using a ferric chloride solution. This forms the depressed portion 11*b* and the protruding portions 11*a* in the substrate 11. The depressed portion 11b and the protruding portions 11a are formed with reference to the protruding portion locating circuit 14 which is formed simultaneously with the pad 13a for mounting the optical element by the semi-additive process. Therefore, the depressed portion 11b and the protruding portions 11a are located and formed at predetermined locations with respect to the pad 13a for mounting the optical element. Further, the height of the protruding portions 11a is similar to the thickness of the substrate 11, and the outside diameter of the protruding portions 11a is set to be equivalent to or slightly larger than the inside diameter of the fitting holes 3a (see FIG. 1A) into which the protruding portions 11a fit.

Figure 5D:
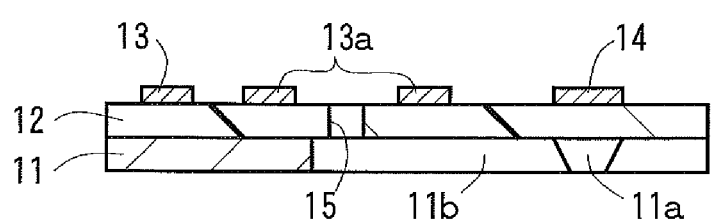

Then, as illustrated in FIG. 5D as a longitudinal sectional view, the through hole 15 for the optical path is formed by laser processing or the like in a portion of the electric circuit board (insulating layer 12) which corresponds to the center of the pad 13a for mounting the optical element.

Figure 5E:
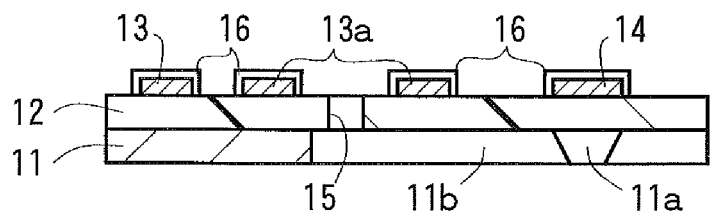

Then, by performing electrolytic plating processing, as illustrated in FIG. 5E as a longitudinal sectional view, a plating layer 16 is formed on surfaces of the electric circuit 13 including the pad 13a for mounting the optical element and the protruding portion locating circuit 14. After that, the photosensitive resist is separated by a sodium hydroxide solution or the like. Note that, examples of the component of the plating layer 16 include gold, nickel, or the like. Further, the thickness of the plating layer 16 is ordinarily set within a range of, for example, 0.2 to 0.5 μm.

Figure 5F:
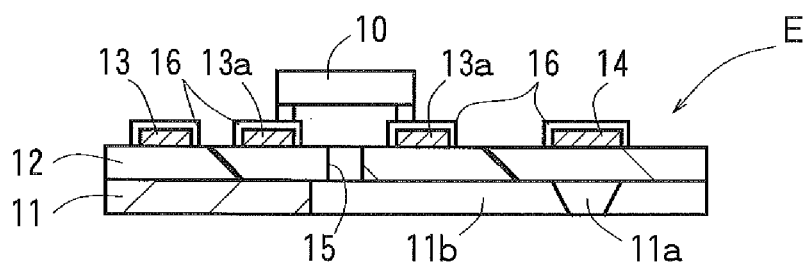

Then, as illustrated in FIG. 5F as a longitudinal sectional view, the optical element 10 is mounted on a surface of the pad 13a for mounting the optical element via the plating layer 16. After that, as necessary, the optical element 10 and a portion therearound are encapsulated in resin (not shown). In this way, the electric circuit unit E including the protruding portions 11a is obtained. Here, as described above, the depressed portion 11b and the protruding portions 11a formed in the step illustrated in FIG. 5C are located and formed at the predetermined locations with respect to the pad 13a for mounting the optical element. Therefore, the optical element 10 mounted on the pad 13a for mounting the optical element and the depressed portion 11b as well as the protruding portions 11a are in a positional relationship of being located with respect to each other. In this way, the step of manufacturing the electric circuit unit E of the above-mentioned item (2) is completed.

<(3) Step of Coupling Optical Waveguide Unit W and Electric Circuit Unit E>

Next, the step of coupling the optical waveguide unit W and the electric circuit unit E is described. In this coupling, the one end of the optical waveguide unit W is caused to fit into the depressed portion 11b of the electric circuit unit E, and the protruding portions 11a in the depressed portion 11b are caused to fit into the fitting holes 3a of the optical waveguide unit W, respectively, to thereby integrate the optical waveguide unit W and the electric circuit unit E (see FIGS. 1A and 1B). After that, as necessary, the optical waveguide unit W and the electric circuit unit E are fixed to each other with an adhesive or a pressure-sensitive tape. In this way, the step of coupling the optical waveguide unit W and the electric circuit unit E of the above-mentioned item (3) is completed, and the opto-electric hybrid board is completed which is the goal.

Here, as described above, in the optical waveguide unit W, the one end surface 2a of the core 2 and the fitting holes 3a for locating the electric circuit unit are in a positional relationship of being located with respect to each other. Further, in the electric circuit unit E having the optical element 10 mounted thereon, the optical element 10 and the protruding portions 11a which fit into the fitting holes 3a, respectively, are in a positional relationship of being located with respect to each other. Therefore, when the protruding portions 11a are caused to fit into the fitting holes 3a, respectively, as described above to manufacture the opto-electric hybrid board, the one end surface 2a of the core 2 and the optical element 10 are automatically aligned. As a result, in manufacturing the opto-electric hybrid board, an aligning operation which takes time and effort is not necessary. In other words, the opto-electric hybrid board is excellent in mass-productivity.

Further, in this embodiment, the depressed portion 11b into which the one end of the optical waveguide unit W fits is formed in the electric circuit unit E. Therefore, by fitting the one end of the optical waveguide unit W into the depressed portion 11b, it is possible to prevent misalignment of the optical waveguide unit W with respect to the electric circuit unit E with greater reliability and maintain the alignment between the core 2 and the optical element 10 with greater reliability.

In addition, the fitting holes 3a of the optical waveguide unit W are formed in the surface of the overcladding layer 3 which forms the optical waveguide unit W. Further, the protruding portions 11a of the electric circuit unit E are formed of a part of the substrate 11 which forms the electric circuit unit E. In other words, an additional component such as a connector is not provided for the purpose of fitting the protruding portions 11a into the fitting holes 3a. Therefore, in the coupling between the optical waveguide unit W and the electric circuit unit E, there is no accumulation of dimensional deviations and misalignments due to an additional component such as a connector, and the core 2 of the optical waveguide unit W and the optical element 10 of the electric circuit unit E are aligned with high accuracy. Further, an additional component such as a connector is not necessary for fitting the protruding portions 11a into the fitting holes 3a, and thus control of the dimensional accuracy of the connector or the like is not necessary. In this regard, also, the opto-electric hybrid board is excellent in mass-productivity.

Note that, in the embodiment above, the depressed portion 11b into which the one end of the optical waveguide unit W fits is formed by removing the predetermined range of the substrate 11 of the electric circuit unit E, but the depressed portion 11b may be omitted insofar as the protruding portions 11a are formed. Specifically, a portion of the substrate 11 which is larger than the one end of the optical waveguide unit W may be removed. Also in this case, by fitting the protruding portions 11a of the electric circuit unit E into the fitting holes 3a of the optical waveguide unit W, respectively, the one end surface 2a of the core 2 and the optical element 10 may be automatically aligned.

Further, in the embodiment above, description is made with regard to one end of the opto-electric hybrid board, but the other end may have a structure which is similar to that of the one end of the embodiment above. In this case, as the optical element 10, by, for example, mounting a light-emitting element on the one end side and mounting a light-receiving element on the other end side, light from the light-emitting element may be received by the light-receiving element via the core 2.

Further, in the embodiment above, in the step of manufacturing the electric circuit unit E, the plating layer 16 is formed on the surfaces of the pad 13a for mounting the optical element, the electric circuit 13, and the protruding portion locating circuit 14, but the plating layer 16 is formed as necessary, and is not required to be formed when unnecessary.

Next, examples are described. However, the present invention is not limited to the examples.

EXAMPLES

Forming Materials for Undercladding Layer and Overcladding Layer

Component A (solid epoxy resin): epoxy resin including an aromatic ring skeleton (EPICOAT 1002 manufactured by Mitsubishi Chemical Corporation)
70 parts by weight
Component B (solid epoxy resin): epoxy resin including an alicyclic skeleton (EHPE3150 manufactured by Daicel Chemical Industries Ltd.) 30 parts by weight
Component C (photoacid generator): triarylsulfonium salt, 50% solution in propylene carbonate (CPI-200K manufactured by San-Apro Ltd.)
2 parts by weight
Those Components A to C were dissolved in 55 parts by weight of ethyl lactate (produced by Musashino Chemical Laboratory, Ltd.) through agitation (temperature at 80° C. and agitation of 250 rpm for 3 hours) to prepare the undercladding layer and overcladding layer forming material (photosensitive resin composition). The viscosity of the photosensitive resin composition was measured using a digital viscometer (HBDV-I+CP manufactured by Brookfield Engineering Laboratories). The viscosity was 1,320 mPa·s.

<Forming Material for Core>
Component D: o-cresol novolak glycidyl ether (YDCN-700-10 manufactured by Nippon Steel Chemical Co., Ltd) 100 parts by weight
This Component D and 1 part by weight of the above-mentioned Component C were dissolved in 60 parts by weight of ethyl lactate (produced by Musashino Chemical Laboratory, Ltd.) through agitation (temperature at 80° C. and agitation of 250 rpm for 3 hours) to prepare the core forming material (photosensitive resin composition). The viscosity of the photosensitive resin composition was measured using the digital viscometer. The viscosity was 1,900 mPa·s.

Example 1

Manufacture of Optical Waveguide Unit

The above-mentioned undercladding layer, core, and overcladding layer forming materials were used to manufacture the optical waveguide unit including the cylindrical fitting holes for locating the electric circuit unit similarly to the case of the embodiment above. The thickness of the undercladding layer was 25 μm, the thickness of the core was 50 μm, and the thickness of the overcladding layer (thickness from the surface of the undercladding layer) was 75 μm. With regard to the dimensions of the fitting holes, the inside diameter was 2.0 mm and the depth was 75 μm.

<Manufacture of Electric Circuit Unit>
Similarly to the case of the embodiment above, the electric circuit unit was manufactured, which included the substrate made of a stainless steel (having a thickness of 55 μm), the insulating layer (having a thickness of 10 μm), the electric circuit and the protruding portion locating circuit having the plating layer formed thereon (having a thickness of 12.5 μm including the plating layer), the rectangular depressed portion into which the one end of the optical waveguide unit fits, and the protruding portions each having the shape of a frustum of a cone and which fit into the fitting holes for locating the electric circuit unit. With regard to the dimensions of the protruding portions, the diameter of the bottom surface (large diameter portion) was 2.0 mm, the diameter of the top surface (small diameter portion) was 1.6 mm, and the height was 55 μm. Note that, as the optical element, a light-emitting element of a flip chip type (ULM850-10-TT-C0104U manufactured by U-L-M Photonics) was mounted. Further, after the optical element was mounted, underfill encapsulation of the optical element was performed with a transparent resin (LED encapsulating resin NT-8038 manufactured by NITTO DENKO CORPORATION).

<Manufacture of Opto-Electric Hybrid Board>
The protruding portions of the electric circuit unit were caused to fit into the fitting holes of the optical waveguide unit to integrate the optical waveguide unit and the electric circuit unit. Then, both units were fixed to each other with an adhesive.

<Light Propagation Test>
A current was caused to flow through the light-emitting element of the opto-electric hybrid board of Example 1 and light was caused to exit from the light-emitting element. It was confirmed that light exited from the other end of the core of the opto-electric hybrid board.

Example 2

Manufacture of Optical Waveguide Unit

An optical waveguide unit was manufactured, which was the optical waveguide unit of Example 1 with the other end having, similarly to the one end, fitting holes for locating the electric circuit unit. Other portions of Example 2 were formed similarly to those of Example 1.

<Manufacture of Electric Circuit Unit>
An electric circuit unit similar to the one in Example 1 was manufactured. Further, the electric circuit unit formed was the electric circuit unit in Example 1 having, instead of the light-emitting element, a light-receiving element of a flip chip type (PDCA04-70-GS manufactured by Albis Optoelectronics) mounted thereon.

<Manufacture of Opto-Electric Hybrid Board>
Similarly to the case of Example 1, the electric circuit unit having the light-emitting element mounted thereon was fixed to one end of the optical waveguide unit and the electric circuit unit having the light-receiving element mounted thereon was fixed to the other end of the optical waveguide unit.

<Signal Transmission Test>
A current was caused to flow through the light-emitting element of the opto-electric hybrid board of Example 2, and light was caused to exit from the light-emitting element. It was confirmed that the light was received by the light-receiving element.

From the results of Examples 1 and 2 above, it can be found that, in the manufacturing method described above, even without an aligning operation of the core of the optical waveguide unit and the optical element (light-emitting element or light-receiving element) of the electric circuit unit, the obtained opto-electric hybrid board may appropriately propagate light.

Note that, in the case in which the electric circuit unit without the depressed portion was manufactured and a test similar to the one above was done, the obtained result was that light was appropriately propagated without an aligning operation.

The opto-electric hybrid board according to the present invention may be used in an information-communication device, a signal processing device, or the like, which transmits and processes at high speed a digital audio signal, a digital image signal, or the like.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. An opto-electric hybrid board, comprising:
    an optical waveguide unit; and
    an electric circuit unit having an optical element mounted thereon, the electric circuit unit being coupled to the optical waveguide unit,
    wherein the optical waveguide unit comprises:
        an undercladding layer;
        a core for an optical path, the core being formed on a surface of the undercladding layer;
        an overcladding layer which covers the core; and
        a fitting hole for locating the electric circuit unit, the fitting hole being formed in a surface of the overcladding layer;
    wherein the electric circuit unit comprises:
        an electric circuit board;
        the optical element mounted at a predetermined portion on the electric circuit board; and
        a protruding portion which fits into the fitting hole;
    wherein the fitting hole of the optical waveguide unit is located and formed at a predetermined location with respect to an end surface of the core;
    wherein the protruding portion of the electric circuit unit is located and formed at a predetermined location with respect to the optical element;
    wherein the optical waveguide unit and the electric circuit unit are coupled to each other in a state in which the protruding portion of the electric circuit unit fits into the fitting hole of the optical waveguide unit; and
    wherein shapes of the fitting hole and the protruding portion are non-complementary.

2. The opto-electric hybrid board according to claim 1, wherein a depressed portion into which an end of the optical waveguide unit fits is formed in the electric circuit unit, and the protruding portion is formed in the depressed portion.

3. A manufacturing method for an opto-electric hybrid board in which an optical waveguide unit and an electric circuit unit having an optical element mounted thereon are coupled, the method comprising:
    manufacturing the optical waveguide unit comprising:
        forming an undercladding layer;
        forming, on a surface of the undercladding layer, a core for an optical path; and
        forming an overcladding layer so as to cover the core, the forming of the overcladding layer comprising forming a fitting hole for locating the electric circuit unit at a predetermined location located with respect to an end surface of the core;
    manufacturing the electric circuit unit comprising:
        forming an electric circuit board; and
        mounting the optical element at a predetermined portion on the electric circuit board, the forming of the electric circuit board comprising forming a protruding portion which fits into the fitting hole at a predetermined location located with respect to an expected mounting location of the optical element; and
    coupling the optical waveguide unit and the electric circuit unit, the coupling comprising fitting the protruding portion of the electric circuit unit into the fitting hole of the optical waveguide unit
    wherein the optical waveguide unit and the electric circuit unit are separately manufactured and then coupled.

4. The manufacturing method for an opto-electric hybrid board according to claim 3, further comprising forming a depressed portion into which an end of the optical waveguide unit fits in the electric circuit unit, and forming the protruding portion in the depressed portion.

5. The opto-electric hybrid board according to claim 1,
    wherein the fitting hole has a shape of a cylinder, and
    wherein the protruding portion has a shape of a frustum of a cone.

6. The manufacturing method for an opto-electric hybrid board according to claim 3,
    wherein the fitting hole is formed by photolithography, and
    wherein the protruding portion is formed by etching.

7. The manufacturing method for an opto-electric hybrid board according to claim 6,
    wherein the fitting hole has a shape of a cylinder, and
    wherein the protruding portion has a shape of a frustum of a cone.

* * * * *